United States Patent [19]

Suzuki

[11] Patent Number: 4,634,643
[45] Date of Patent: Jan. 6, 1987

[54] X-RAY MASK AND METHOD OF MANUFACTURING THE SAME

[75] Inventor: Katsumi Suzuki, Tokyo, Japan

[73] Assignee: NEC, Japan

[21] Appl. No.: 723,052

[22] Filed: Apr. 15, 1985

[30] Foreign Application Priority Data

Apr. 18, 1984 [JP] Japan ................................. 59-77745

[51] Int. Cl.[4] ............................................ H01L 71/30
[52] U.S. Cl. .......................................... 430/5; 378/34; 378/35
[58] Field of Search ........................ 378/34, 35; 430/5

[56] References Cited

U.S. PATENT DOCUMENTS 4,037,111  7/1977  Coquin et al. ......................... 378/35

FOREIGN PATENT DOCUMENTS 0079447  6/1980  Japan ...................................... 430/5

OTHER PUBLICATIONS

Extended Abstracts of the 16th (1984 International) Conference on Solid State Devices and Materials, Kobe, 1984, pp. 23-26.

J. Vac. Sci. Technol., 1982, 20-2, pp. 191-194.

Primary Examiner—John E. Kittle
Assistant Examiner—Patrick J. Ryan
Attorney, Agent, or Firm—Laff, Whitesel, Conte & Saret

[57] ABSTRACT

Herein disclosed are a mask for X-ray exposure composed of a X-ray absorbing layer of tungsten having a desired pattern, a membrane transparent to X-ray and supporting the X-ray absorbing layer, a frame member reinforcing and supporting the membrane at the periphery thereof and films of titanium and/or nickel provided between the membrane and the X-ray absorbing layer. The mask makes it possible to obtain an accurate replication of extremely fine patterns and the desired pattern of the mask can be prepared by the direct dry etching of the X-ray absorbing layer using a resist pattern as the etching mask.

6 Claims, 10 Drawing Figures

X-RAY MASK AND METHOD OF MANUFACTURING THE SAME

FIELD OF THE INVENTION

The present invention relates to a mask used for X-ray exposure which is very useful to replicate accurate submicron patterns and a method of manufacturing the same.

DESCRIPTION OF THE PRIOR ART

In the electronic industries, the photolithography technique is an important technique for industrially replicating fine patterns by utilizing materials sensitive to light or radiation.

Recently, it has been directed to achieve high density mounting and miniaturization in the field of semiconductor devices such as LSI, IC. In order to accomplish such purposes, X-ray lithography technique draw a great attention, because an X-ray has a quite short wave length. The method of X-ray lithography employs a soft X-ray generated from a metallic target by colliding an electron beam, and irradiates the X-ray through an X-ray mask on a resist applied to a major surface of a semiconductor wafer to form fine patterns. It is well known that the X-ray lithography technique permits to prevent the shading of the pattern due to the diffraction and interferance of light, because X-ray has a quite short wave length, to reduce proximity effect because of low scattering property of X-ray in the resist and substrate compared to other light source such as electron beam and to form patterns without affection of the external field or the charge carried by the resist or the substrate.

In the X-ray pattern transfer technique, it is necessary to use an X-ray mask as mentioned above. In order to produce an accurate pattern of submicron order, the mask should satisfy a lot of strict requirements.

The X-ray mask conventionally used comprises a thin film, that is, membrane transparent to soft X-ray having a wave length of several angstroms to 10 angstroms, an X-ray absorbing layer formed on the thin membrane and composed of a heavy metal such as Au (gold), Pt (platinum) having high X-ray absorbance and a frame supporting and fixing the thin membrane at the periphery thereof and composed of single crystal of Si (silicon), quartz glass or the like.

In the conventional X-ray mask, the thickness of the X-ray absorbing layer of Au or Pt having a desired pattern should be at least about 0.8 $\mu$m to obtain a high mask contrast against the characteristic X-ray such as MoL ($\lambda=5.4$ Å), SiK ($\lambda=7.1$ Å) or PdL ($\lambda=4.4$ Å) which is believed to have the optimum efficiency as the light source for X-ray lithography. Therefore, when the pattern width is 0.5 $\mu$m, an aspect ratio (thickness/width) becomes 1.6 or more. The aspect ratio must be equal to or less than 1.5. Because, if the X-ray mask having a pattern of a large aspect ratio is used, the accuracy of the pattern transferred or replicated is remarkably lowered and the shading due to penumbra becomes high since the X-ray source excited by the electron beam is simply a point source and as a result, the mask pattern is transferred on a semiconductor substrate by the X-ray beam radially diverged.

Moreover, it is almost impossible to form a pattern having a thickness of around 0.8 $\mu$m or more such as 1 $\mu$m by the conventional dry etching technique in which a resist pattern of thin film formed according to, for example, electron beam exposure is used, since Au or Pt used as materials for the mask pattern (X-ray absorbing pattern) is chemically inert. Under such circumstances, the pattern of thick film is conventionally formed according to a method which comprises (i) subjecting a lower layer of organic film having a large thickness to patterning procedure by reactive ion etching under the presence of oxygen gas, in which a pattern of a metal such as Ti (titanium) previously formed according to lift off method is used as the etching mask and then selectively plating Au or Pt on the openings of the pattern of organic film, or (ii) previously forming a thick film of Au or Pt under a pattern of organic film and etching the Au or Pt film in which the pattern of the organic film acts as the mask.

Comparing the conventional method of manufacturing X-ray mask to that of manufacturing an usual photomask, the former is very complicated and presents a lot of disadvantages such as the formation of different defects (for instance, the abnormal deposition due to field locally concentrated), the low controllability of line width and the low productivity.

In order to improve the X-ray mask with Au or Pt pattern, A. Ozawa et al. purposes an X-ray mask in which Ta (tantalum) is used as the material for X-ray absorbing pattern instead of Au or Pt (see, Extended Abstracts of the 16th (1984 International) Conference on Solid State Devices and Materials, Kobe, 1984, pp 23-26. According to the method of A. Ozawa et al., the X-ray mask may be manufactured by depositing Ta and $SiO_2$ films, in this order, on a mask substrate by electron cycrotron resonance (ECR) plasma deposition technique at a desired thickness, forming a desired resist pattern on the $SiO_2$ film, then etching the $SiO_2$ film by reactive ion etching technique (etching gas: $C_2F_6$) utilizing the resist pattern as the etching mask to form a desired pattern on the $SiO_2$ film and finally etching the Ta film by the same technique as in the latest step (etching gas: $CBrF_3$) utilizing the $SiO_2$ pattern formed as the etching mask to obtain a desired pattern of the Ta film.

However, the method still leaves room for improvement since the method is complicated in its construction and insufficient in the controllability of the line width of the pattern, although the method makes it possible to reduce defects, because it does not include lift off and plating processes.

SUMMARY OF THE INVENTION

Under such circumstances, the inventors of this application have conducted exhaustive research for accomplishing the improvement of the mask for X-ray exposure and found that it is quite effective to use W (tungsten) as the X-ray absorbing layer and to provide Ti (titanium) film and/or Ni (nickel) film under the X-ray absorbing layer, as the etching stopper and/or the adhesive improving film (between the X-ray absorbing layer and the membrane transparent to X-ray).

Then, the principal purpose of this invention is to provide a mask for X-ray lithography which permits to conduct an accurate replication of fine patterns.

Another purpose of this invention is to provide an improved mask for X-ray lithography which presents low shading due to penumbra.

A further object of the invention is to provide a method of manufacturing the mask for X-ray lithography.

A still further object of this invention is to provide a simple method of manufacturing such an X-ray mask which is excellent in the controllability of line width of the pattern.

The aforementioned and other purposes of this invention may be accomplished by an X-ray mask which comprises at least an X-ray absorbing layer of tungsten having a desired pattern, a thin membrane transparent to X-ray and supporting the X-ray absorbing layer and a frame reinforcing and supporting the thin membrane at the periphery thereof and titanium film and/or nickel film provided between the X-ray absorbing layer and the thin membrane transparent to X-ray.

The X-ray mask of this invention may be manufactured according to a method which comprises the steps of forming a membrane transparent to X-ray on one side of a substrate, forming a thin film of titanium or nickel and a layer of tungsten; or films of titanium and nickel and a layer of tungsten, in this order, on the membrane transparent to X-ray, forming a desired resist pattern on the tungsten layer, subjecting the layer of tungsten to selective etching and removing a part of the substrate by etching it from the other side thereof.

The thickness of W layer is preferably from 0.5 $\mu$m to 0.7 $\mu$m. When W layer is less than 0.5 $\mu$m, the X-ray cannot be effectively absorbed. On the other hand, if the thickness is more than 0.7 $\mu$m, the aspect ratio becomes more than 1.4 even if the width is 0.5 $\mu$m, and therefore, the precise patterning cannot be expected. Furthermore, if the thickness is more than 0.7 $\mu$m, the patterning of the W layer cannot be easily conducted. The thickness of Ti film or Ni film is preferably ranging from 50 to 200 Å by considering its role mentioned above.

DESCRIPTION OF THE PREFERRED EMBODIMENTS

Figure 1A:
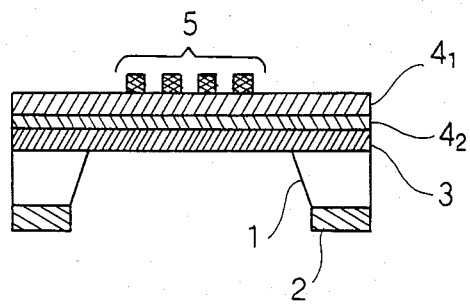
FIG. 1 (a) and (b) respectively show illustrative sectional view of two different embodiments of the mask according to the invention.
Figure 1B:
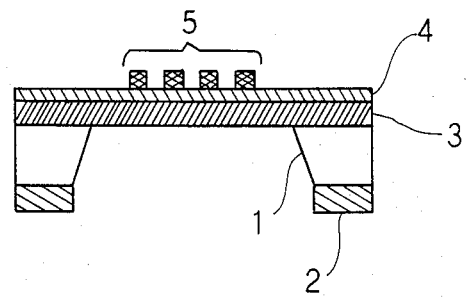
Figure 2A:
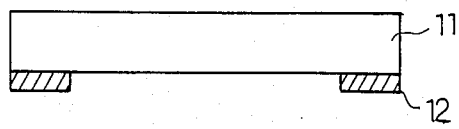
FIG. 2 (a) to (d) show the steps of a preferred method of manufacturing an X-ray according to the invention, each step being expressed as an illustrative sectional view.
Figure 2B:
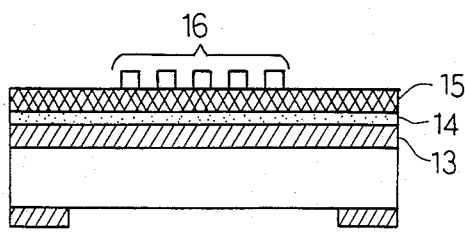
Figure 2C:
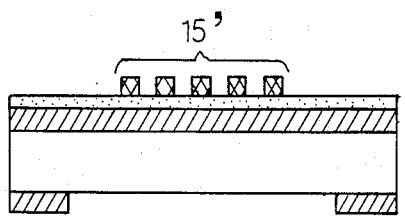
Figure 2D:
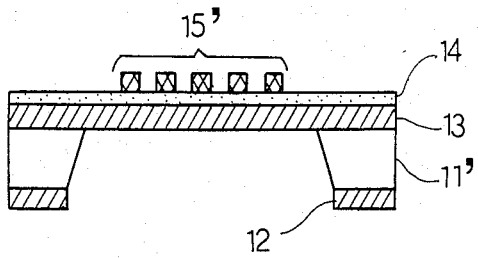
Figure 3A:
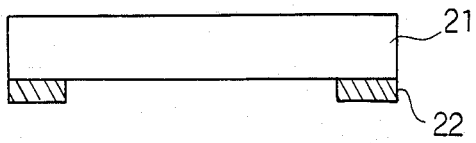
FIG. 3 (a) to (d) show the steps of another preferred method of manufacturing a mask of this invention, each step being an illustrative sectional view.
Figure 3B:
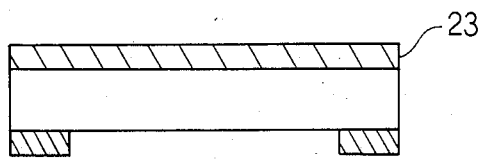
Figure 3C:
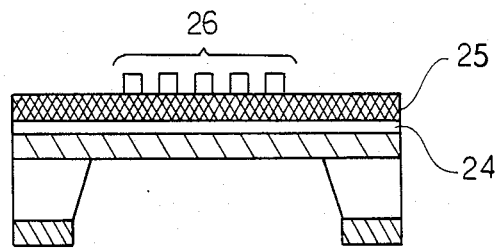
Figure 3D:
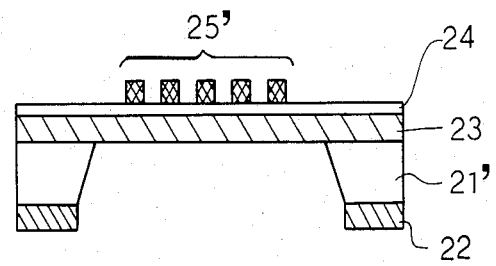

In FIG. 1 (a) and (b), two preferred embodiments of the X-ray mask according to the invention are shown as the illustrative sectional view.

The example shown in FIG. 1 (a) has a laminated structure composed of three layers of different material and is composed of a substrate 1, a membrane 3 transparent to X-ray, a film of Ti $4_1$ of 100 Å in thickness, a film of Ni $4_2$ of 100 Å in thickness and a layer of W 5 of 6,000 Å in thickness formed into a desired pattern.

On the other hand, the laminated structure of the embodiment shown in FIG. 1 (b) includes two layers. The lower layer 4 is composed of Ti or Ni film of 100 Å in thickness respectively, and the upper layer 5 is composed of W layer formed into a desired pattern.

In these embodiments, the numeral 2 represents a member which is used as the etching mask during the procedure for removing part of the substrate and the member may also be a part of the frame supporting and reinforcing the membrane transparent to X-ray. Moreover, in these two cases, one of the layer of W absorbs X-ray and the Ti film and/or Ni film are transparent to X-ray.

The material for substrate may be any one of known materials such as single crystals of semiconductors, for example, single crystal silicon, and quartz glass. In general, the thickness thereof is from several hundreds of micrometer to several millimeter.

On one side of the substrate, a thin membrane transparent to X-ray and supporting an X-ray absorbing layer formed thereon, is deposited and the thickness thereof is, in general, in the range of from several thousands of angstrom to several micrometers. Preferred materials for the thin membrane are Si, boron nitride (BN), polyimide, SiC, $Si_yN_x$ (including $Si_3N_4$), $Si_3N_4$—$SiO_2$ and the membrane may be formed according to any one of known technique such as CVD, plasma CVD, sputtering, ion-plating.

The thin films of Ti or Ni and W; or Ti, Ni and W may then be deposited, in this order, on the membrane transparent to X-ray thus formed.

The preferred thickness of the film of Ti and Ni is from 50 angstrom to 200 angstrom. These films play an important role during the etching procedure of W layer mentioned below. On the one hand, these films act as a stopper for etching. If these films are absent, the etching of W film proceed to an undue extent such that the membrane transparent to X-ray, which has an etch rate as high as that of W, is also etched. On the other hand, the films also act as an adhesive to enhance the adhesive force between the membrane and the W layer.

The preferred thickness of the W layer is in the range of from 0.5 $\mu$m to 0.7 $\mu$m as mentioned above. This layer really acts as the X-ray absorbing layer and therefore, the thickness thereof is important. The W layer is subjected to etching treatment to form a desired pattern. This is preferably carried out as follows. A resist is first applied to the surface of the W layer and a desired resist pattern is formed according to a conventional manner such as electron-beam or ion-beam exposure technique. At this stage, as the resist material, there may be mentioned, for example, electron-beam resists such as chloromethylated polystyrene (CMS), COP of Mead Co. Ltd., SEL-N (manufactured and sold by Somal), polymethylmethacrylate (PMMA), RF-5000P (manufactured and sold by Hitachi Kasei Co. Ltd.).

It is also important to choose a resist material which has a high selective etching ratio against W so that the excellent etching of W layer can be accomplished.

The etching of the W layer is carried out according to a dry etching such as reactive ion etching (RIE) utilizing said resist pattern as the mask. In this step, there may be mentioned such as $SF_6$, $NF_3$, $CF_4$, $C_2F_6$ or a mixture of $SF_6$ and $Cl_2$ as the etching gas.

Finally, a part of the substrate is removed by etching it from the back side thereof till the thin membrane transparent to X-ray is exposed to air while remaining the periphery thereof as it is and thus a desired mask for X-ray exposure may be obtained.

The removal of a part of the substrate may be effected, for example, according to a method which comprises depositing a material for mask on the back side of the substrate and subjecting the deposit to a conventional photolithography to form a desired mask pattern and then removing part of the substrate by an usual etching technique such as wet etching, for instance, using an alkali aqueous solution (when the substrate is single crystal silicon) or a dry etching, in which the resist pattern acts as the mask.

This step for removing part of the substrate may be carried out before the deposition of the Ti and/or Ni films or after the formation of the desired pattern of W layer. In the latter case, the W pattern should be protected in a known manner during the etching procedure. The protection of the pattern may be carried out by using an exclusively designed holder which comprises an O-ring.

As the materials for mask used in the process for etching the substrate, there may be mentioned such as $Si_3N_4$, $Al_2O_3$, SiC, $Si_3N_4+SiO_2$ and the deposition of these material may be conducted by any conventional manner such as CVD, plasma CVD, sputtering or the like. The preferred thickness of the layer to be deposited is in the range of from several hundreds of angstrom to several thousands of angstrom.

Thus, according to the present invention, an excellent mask for X-ray exposure may be provided and the mask permits to accurately replicate and transfer fine (submicron order) patterns or a semiconductor wafer and as a result, various kinds of fine devices and fine circuit patterns may be fabricated by using such an excellent mask.

In order to form a desired pattern of X-ray mask, it is conventionally necessary to convert a resist pattern prepared by a technique such as electron beam exposure to another metallic pattern or $SiO_2$ pattern and then again to form X-ray absorbing pattern utilizing the metallic or $SiO_2$ pattern as the mask. However, according to the present invention, W pattern which acts as the X-ray absorbing pattern can directly be formed from a resist pattern by a dry etching procedure. That is, the process of this invention is quite simple and excellent in the line width controllability and therefore, permits to largely reduce the density of defects.

In addition, W as used in the invention has a quite high absorption coefficient to MoL ray. Therefore, the W pattern provides sufficiently high mask contrast even at the thickness of about 0.5 $\mu$m and it also permits to reduce shading due to penumbra which may reduce the accuracy of the mask pattern.

The present invention will be explained in more concretely in the light of the following illustrative examples described referring to attached drawings.

EXAMPLE 1

In this example, a preferred embodiment of the mask for X-ray exposure of the invention is produced according to the process shown in FIG. 2 which shows a process for fabricating a mask as illustrative sectional views. Single crystal silicon having a thickness of about 400 $\mu$m and (100) crystal face is used as the mask substrate 11. To one side of the substrate (on the (100) face), $Si_3N_4$ was first deposited at a thickness of about 2000 Å according to CVD technique to form a layer and then the layer of $Si_3N_4$ formed was subjectd to etching by a conventional photolithography to obtain a desired $Si_3N_4$ film pattern 12 (see FIG. 2 (a)). On the other side of the substrate 11, a membrane of $Si_yN_x$ 13 was deposited in a thickness of 1 $\mu$m by the technique of plasma CVD. Up to this stage, the procedures may be carried out according to a method disclosed in J. Vac., Sci. & Tech., 1982, 20-2, 191–194 and developed by one of the inventors of this application.

Furthermore, Ti and W were deposited, in this order, on the $Si_yN_x$ film 13 to form a film of Ti 14 and a layer of W 15 by sputtering technique as shown in FIG. 2 (b). The thickness of the Ti film was about 100 Å and that of the W layer was about 6000 Å. Thereafter, the surface of the w layer 15 was coated with a resist wshich was then converted to a desired resist pattern 16 according to electron beam exposure technique (FIG. 2 (b)).

Then, the tungsten layer 15 was subjected to the reactive ion etching, in which $SF_6$ was used as the etching gas and the resist pattern was used as the etching mask, to form a desired pattern 15' of tungsten layer (see FIG. 2 (c)). At this stage, the film of Ti 14 was exposed to the air. However, the Ti film should not be etched necessarily and the etching procedure may be stopped at the time when the etching of the desired region of the W layer was completed.

Finally, the substrate 11 was etched with boiling 30% KOH solution using $Si_3N_4$ pattern 12 previously formed as the etching mask, while protecting the W pattern 15' according to a conventional manner to remove the desired region of the substrate and to obtain a mask for X-ray exposure according to the invention (FIG. 2 (d)).

EXAMPLE 2.

According to the method shown in FIG. 3 wherein the steps of the method are described as illustrative sectional views, the second preferred mask for X-ray exposure was prepared.

According to the same procedure as set forth in the example 1, on one side of the single crystal silicon 21 having (100) crystal face and a thickness of about 400 $\mu$m, $Si_3N_4$ was firstly deposited to form a film of 2000 Å in thick and the film was subjected to a photolithography procedure to obtain a desired pattern of $Si_3N_4$ film 22 (see FIG. 3 (a)). A $Si_yN_x$ membrane 23 was formed on the other side of the substrate by the plasma CVD technique (1 $\mu$m in thick) and then the desired region of the substrate 21 was removed by dipping it in boiling 30% KOH aqueous solution (FIG. 3(b)).

On the surface of the $Si_yN_x$ membrane 23, a film of Ti 24 and a layer of W 25 were then formed, in this order, at the thickness of about 100 Å and about 6000 Å respectively and the resist pattern 26 was formed according to the same manner as in the example 1 (FIG. 3 (c)).

Finally, using the resist pattern 26 as the etching mask, the W layer was etched to form a desired pattern 25' and obtained a mask for X-ray exposure as shown in FIG. 3 (d).

As seen from these examples, a highly accurate mask for X-ray exposure can be prepared by an exteremly simplified method compared to known processes. Moreover, the W pattern of the mask presents a high contrast of more than 11 dB against the MoL beam which is believed to have the highest X-ray power among the most practical electron beam excited X-ray source, even at the thickness of about 0.5 $\mu$m.

We claim:

1. A mask for X-ray exposure comprising an X-ray absorbing layer of tungsten having a thickness in the order of 0.5 $\mu$m to 0.7 $\mu$m and having a desired pattern, a membrane which is transparent to X-ray for supporting said X-ray absorbing layer, a frame member reinforcing and supporting said membrane at the periphery thereof and a thin metallic film of titanium or nickel which has a thickness in the order of 50 Å to 200 Å and which is transparent to X-rays; or titanium and nickel which is transparent to X-ray and is provided between said X-ray absorbing layer and said membrane, the metallic film being present across the entire surface of said membrane.

2. A method of manufacturing a mask for X-ray exposure which comprises the steps of:
- forming a membrane which is transparent to X-ray, said membrane being on one side of a substrate;
- forming a film of Ti or Ni which is transparent to X-ray and a layer of W or films of Ti and Ni which are transparent to X-ray and a layer of W, in this order, on the membrane which is transparent to X-ray;
- forming a desired resist pattern on the W layer according to electron beam exposure techniques:
- subjecting the W layer to reactive ion etching using the resist as a mask and using the film of Ti or Ni; or Ti and Ni as an etching stopper to obtain a desired pattern of the W layer; and
- removing a part of the substrate by etching the other side of the substrate to make it free from the films.

3. A method of manufacturing a mask for X-ray exposure according to claim 2 in which the step for removing the desired part of the substrate is carried out after the deposition of the membrane trasnparent to X-ray on the substrate.

4. A method of manufacturing a mark for X-ray exposure according to claim 3 in which the step for removing part of the substrate is carried out by wet etching.

5. A method of manufacturing a mask for X-ray exposure according to claim 2 in which the step for removing part of the substrate is carried out after the formation of the X-ray absorbing layer having a desired pattern.

6. A method of manufacturing a mask for X-ray exposure according to claim 5 in which the step for removing part of the substrate is carried out according to the wet etching technique.

* * * * *